United States Patent
Kim et al.

(10) Patent No.: US 12,301,696 B2
(45) Date of Patent: May 13, 2025

(54) DATA EMBEDDED CLOCK SIGNALING TRANSCEIVER AND SYSTEM COMPRISING THE SAME

(71) Applicant: Samsung Electronics Co., Ltd., Suwon-si (KR)

(72) Inventors: Byungsub Kim, Pohang-si (KR); Jaeyoung Seo, Pohang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 18/163,559

(22) Filed: Feb. 2, 2023

(65) Prior Publication Data

US 2023/0269064 A1 Aug. 24, 2023

(30) Foreign Application Priority Data

Feb. 18, 2022 (KR) .................. 10-2022-0021574
Aug. 23, 2022 (KR) .................. 10-2022-0105543

(51) Int. Cl.
| | | |
|---|---|---|
| *H04L 7/00* | (2006.01) | |
| *H03K 3/037* | (2006.01) | |
| *H03K 5/14* | (2014.01) | |
| *H03K 5/24* | (2006.01) | |
| *H03K 19/00* | (2006.01) | |
| *H04B 1/04* | (2006.01) | |
| *H04B 1/16* | (2006.01) | |
| *H03K 5/00* | (2006.01) | |

(52) U.S. Cl.
CPC ............ *H04L 7/0091* (2013.01); *H03K 3/037* (2013.01); *H03K 5/14* (2013.01); *H03K 5/24* (2013.01); *H03K 19/0005* (2013.01); *H04B 1/04* (2013.01); *H04B 1/16* (2013.01); *H03K 2005/00013* (2013.01)

(58) Field of Classification Search
CPC ........... H04B 1/04; H04B 1/16; H04L 7/0091; H04L 7/0008; H03K 3/037; H03K 5/14; H03K 5/24; H03K 19/0005; H03K 2005/00013
See application file for complete search history.

(56) References Cited

U.S. PATENT DOCUMENTS

| | | | |
|---|---|---|---|
| 4,430,745 A * | 2/1984 | Betts | H04L 7/0008 370/477 |
| 6,680,970 B1 | 1/2004 | Mejia | |
| 7,003,686 B2 | 2/2006 | Chua-Eoan et al. | |
| 7,663,442 B2 | 2/2010 | Wu et al. | |
| 8,009,784 B2 | 8/2011 | Ko | |
| 8,649,460 B2 | 2/2014 | Ware et al. | |

(Continued)

*Primary Examiner* — Dac V Ha
(74) *Attorney, Agent, or Firm* — Harness, Dickey & Pierce, P.L.C.

(57) ABSTRACT

A data transmitter includes a transmitting circuit configured to transmit data, the data including alternating odd-numbered data and even-numbered data. The transmitting circuit includes a first flip flop configured to receive the odd-numbered data and generate retimed odd-numbered data, and a second flip flop configured to receive the even-numbered data and generate retimed even-numbered data. The data transmitter includes a clock transmitting circuit configured to supply a clock signal to the transmitting circuit, the clock transmitting circuit including a clock driver configured to transmit the clock signal to a receiver that receives the data.

20 Claims, 13 Drawing Sheets

(56) References Cited

U.S. PATENT DOCUMENTS

| | | |
|---|---|---|
| 9,461,862 B2 | 10/2016 | Holden et al. |
| 10,904,048 B2 * | 1/2021 | Durairaj .............. H04L 27/1566 |
| 2020/0212917 A1 * | 7/2020 | Zerbe .................... H03L 7/0802 |
| 2021/0391974 A1 | 12/2021 | Fujisawa et al. |
| 2024/0097874 A1 * | 3/2024 | Bartling .................. H04B 1/04 |
| 2024/0168091 A1 * | 5/2024 | Jo .................... G01R 31/31726 |

* cited by examiner

DATA EMBEDDED CLOCK SIGNALING TRANSCEIVER AND SYSTEM COMPRISING THE SAME

CROSS-REFERENCE TO RELATED APPLICATIONS

This application claims priority from Korean Patent Application No. 10-2022-0021574 filed on Feb. 18, 2022, and priority from Korean Patent Application No. 10-2022-0105543 filed on Aug. 23, 2022 in the Korean Intellectual Property Office, and all the benefits accruing therefrom under 35 U.S.C. 119, the contents of both of which in their entirety are herein incorporated by reference.

FIELD

Some example embodiments relate to a data embedded clock signaling transceiver and/or a system including the same.

BACKGROUND

Due to the large number of inputs/outputs (I/O) in massively parallel short-reach memory interfaces, areas of a transmitter for transmitting data and a receiver for receiving data increase.

Since there is a desire or need to accurately distribute a clock to a large number of transmitters and receivers, circuits associated with clocking for controlling the clock (for example, a duty cycle correction (DCC) circuit, a duty cycle detection (DCD) circuit or the like) may be included in a transceiver including the transmitter and the receiver.

There is a desire or need to eliminate circuits associated with clocking for reducing the areas of a data transmitter and a data receiver and for an efficient use.

SUMMARY

Aspects of the inventive concepts provide a data transmitter that generates a data embedded clock signal.

Aspects of the inventive concepts provide a data receiver in which an area efficiency is improved, by eliminating the desire or need for a clock and data recovery (CDR) circuit and/or a clock and data alignment (CDA) circuit in a receiver that receives data through the data transmitter that generates the data embedded clock signal.

However, aspects of the inventive concepts are not restricted to the one set forth herein. The other aspects of the inventive concepts will become more apparent to one of ordinary skill in the art to which the present invention pertains by referencing the detailed description of the present invention given below.

According to some aspects of the inventive concepts, a data transmitter includes a transmitting circuit configured to transmit data, the data including alternating odd-numbered data and even-numbered data. The transmitting circuit includes a first flip flop configured to receive the odd-numbered data and generate retimed odd-numbered data, and a second flip flop configured to receive the even-numbered data and generate retimed even-numbered data. The data transmitter includes a clock transmitting circuit configured to supply a clock signal to the transmitting circuit, the clock transmitting circuit including a clock driver configured to transmit the clock signal to a receiver that receives the data.

According to some aspects of the inventive concepts, a data receiver includes a receiving circuit configured to receive data from a transmitter and receive a clock signal from the transmitter, wherein the receiving circuit includes a first type circuit configured to receive the data and clock signal and evaluate the data when an input common mode is low, and a second type circuit configured to receive the data and clock signal and evaluate the data when the input common mode is high, wherein the first type circuit includes a first comparator configured to receive the data and the clock signal to generate a first comparison signal and a second comparison signal, and a first latch configured to receive the first comparison signal and the second comparison signal, and the second type circuit includes a second comparator configured to receive the data and the clock signal to generate a third comparison signal and a fourth comparison signal, and a second latch configured to receive the third comparison signal and the fourth comparison signal.

According to some aspects of the inventive concepts, a data transmitting and receiving system includes a data transmitter which includes a clock transmitting circuit configured to transmit a clock signal, and a transmitting circuit configured to transmit data with modulated amplitude by embedding data in the clock signal, a first channel configured to transmit the data with modulated amplitude, a second channel configured to transmit the clock signal, and a data receiver which includes a receiving circuit connected to the first channel and the second channel. The transmitting circuit is configured to receive data, divide the data into odd-numbered data and even-numbered data intersecting each other, generate the data with modulated amplitude, and transmit the data to the first channel, and the receiving circuit has a first type circuit configured to evaluate data when an input common mode voltage between the data with modulated amplitude and the clock signal is lower than a reference value, and a second type circuit configured to evaluate data when the input common mode voltage is higher than the reference value.

It should be noted that the effects of the inventive concepts are not limited to those described above, and other effects of the inventive concepts will be apparent from the following description.

BRIEF DESCRIPTION OF DRAWINGS

The above and other aspects and features of the inventive concepts will become more apparent by describing in detail example embodiments thereof with reference to the attached drawings, in which.

DETAILED DESCRIPTION

Figure 1:
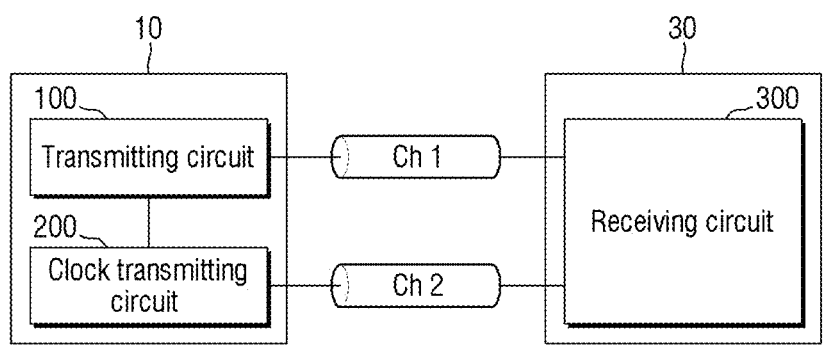
FIG. 1 is a diagram showing a data transmitting and receiving system according to some example embodiments.

FIG. 1 is a diagram showing a data transmitting and receiving system according to some example embodiments.

Referring to FIG. 1, a data transmitting and receiving system 1 may include a data transmitter 10, a first channel (Ch 1), a second channel (Ch 2), and a data receiver 30.

The data transmitting and receiving system 1 may be implemented as a portable electronic device, a computer or a data server. The data transmitter 10 may operate as a transmitter that transmits data, and the data transmitter 10 may include transmitting circuit 100. In an example embodiment, the data transmitter 10 may be implemented as a processor or a memory controller.

The data receiver 30 may operate as a receiver that receives data, and the data receiver 30 may include a receiving circuit 300. In an example embodiment, the data receiver 30 may be a memory device such as a dual in-line memory module (DIMM). The data receiver 30 may include at least one memory element, and as an example, the data receiver 30 may include a volatile memory element such as a DRAM (dynamic random access memory), a SRAM (static random access memory), a RDRAM (Rambus DRAM), a T-RAM (thyristor RAM), a Z-RAM (zero capacitor RAM), and a TTRAM (Twin Transistor RAM), or may include a non-volatile memory element such as an EEPROM (Electrically Erasable Programmable Read-Only Memory), a flash memory, a MRAM (Magnetic RAM), a STT-MRAM (Spin Transfer Torque MRAM), a Conductive bridging RAM (CBRAM), a FeRAM (Ferroelectric RAM), a PRAM (Phase change RAM), a Resistive RAM (RRAM), a nanotube RRAM, a polymer RAM (PoRAM), a nano floating gate memory (NFGM), a holographic memory, a molecular electronics memory device, or an insulator resistance change memory, but example embodiments are not limited thereto.

The data transmitter 10 and the data receiver 30 may be electrically connected to each other through a first channel (Ch 1) and a second channel (Ch 2). The first channel (Ch 1) may transmit data access (e.g., write data, read data, etc.) from the data transmitter 10 to a target device (e.g., the data receiver 30). In an example embodiment, since the first channel (Ch 1) connects the data transmitter 10 and the data receiver 30 through a multi-drop manner, the data transmitter 10 and the data receiver 30 may be connected to one line at the same time.

In an example embodiment in which the data receiver 30 is the target device, the data transmitter 10 may output a transmitting signal including data to be transmitted to the data receiver 30.

The data transmitter 10 also includes a clock transmitting circuit 200 that transfers the clock. The clock transmitting circuit 200 may provide the clock to the data receiver 30, more specifically, the receiving circuit 300, through the second channel (Ch 2).

Accordingly, since the data transmitter 10 according to some example embodiments transmits the clock along with the data to the data receiver 30, the data receiver 30 may not use or require separate circuits associated with clocking (e.g., a duty cycle correction (DCC) circuit, a duty cycle detection (DCD) circuit, or the like).

That is, since the physical size of the data transmitting and receiving system 1 according to some example embodiments may decrease, spaces available for other devices inside the chip including the data transmitting and receiving system 1 may increase.

Hereinafter, the configuration and operation in which the data transmitter 10 according to some example embodiments sends the clock together with the data to the data receiver 30 will be described in detail. Further, the configuration and operation in which the data receiver 30 according to some example embodiments uses the data and clock received from the data transmitter 10 will be described in detail below.

Figure 2:
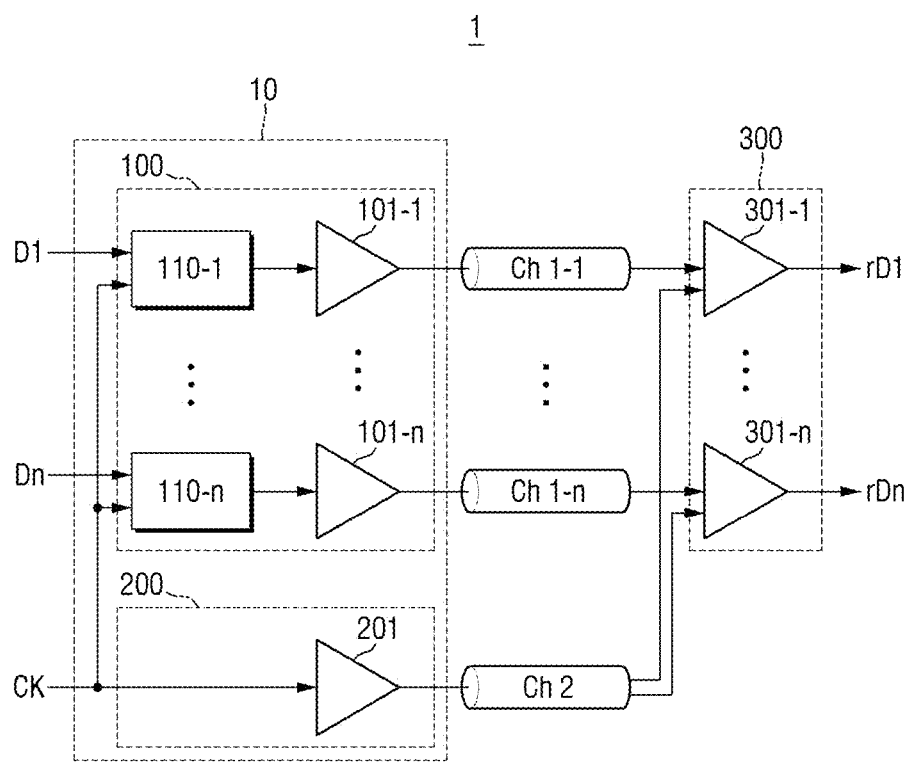
FIG. 2 is another diagram showing a data transmitting and receiving system according to some example embodiments.

FIG. 2 is another diagram showing a data transmitting and receiving system according to some example embodiments.

Referring to FIG. 2, the transmitting circuit 100 of the data transmitter 10 according to some example embodiments transmits a plurality of data (D1 to Dn) to the receiving circuit 300 through a plurality of channels (Ch 1-1 to Ch 1-n). Also, the clock transmitting circuit 200 of the data transmitter 10 according to some example embodiments transmits the clock to the receiving circuit 300 through the second channel (Ch 2).

In more detail, transmitting circuit 100 includes a plurality of data communication lanes (110-1 to 110-n). Each of the data communication lanes (110-1 to 110-n) may be delay circuits including a plurality of logic elements.

The transmitting circuit 100 includes a plurality of drivers (101-1 to 101-n). Each of the plurality of drivers (101-1 to 101-n) may include a data modulation (DM) driver and a weak driver, which will be described below in FIG. 3.

The first data communication lane 110-1 may receive the first data D1 and transfer it to the first driver 101-1. The first driver 101-1 transfers the first data D1 to the receiving circuit 300 through a first-1 channel (Ch 1-1).

Similarly, a n-th data communication lane 110-n may receive the n-th data Dn and transfer it to a n-th driver 101-n. The n-th driver 101-n transmits the n-th data Dn to the receiving circuit 300 through the first-n channel (Ch 1-n).

At this time, the plurality of data communication lanes (110-1 to 110-n) may receive the clock (CK) together.

The clock transmitting circuit 200 includes a clock driver 201. The clock driver 201 receives the clock (CK) and transfers it to the receiving circuit 300 through the second channel (Ch 2).

The receiving circuit 300 includes a plurality of receiving circuit drivers (301-1 to 301-n). Each of the receiving circuit drivers (301-1 to 301-n) may include a comparator and a latch to be described below in FIG. 3.

The first receiving circuit driver 301-1 receives the first data D1 through the first-1 channel (Ch 1-1) and receives the clock (CK) through the second channel (Ch 2) to output a first recovery data rD1.

Similarly, the n-th receiving circuit driver 301-n receives the n-th data Dn through the first-n channel (Ch 1-n) and receives the clock (CK) through the second channel (Ch 2) to output a n-th recovery data rDn.

The received data (rD1 to rDn) may be transmitted data obtained by recovering the transmitted data (D1 to Dn) through the receiving circuit 300.

The inside of the data transmitter 10 and the data receiver 30 according to some embodiments will be described in detail through FIG. 3.

Figure 3:
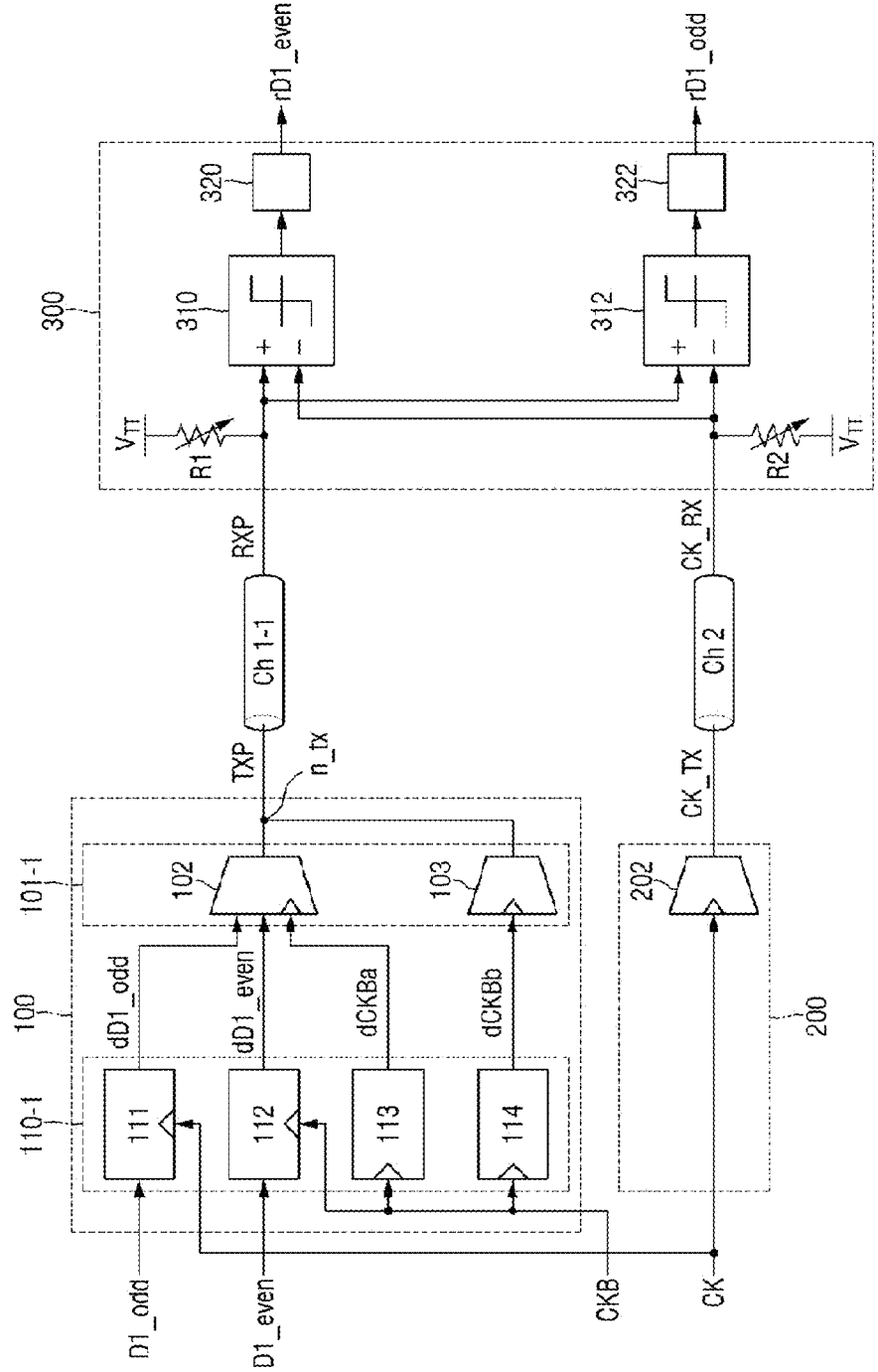
FIG. 3 is another diagram showing the data transmitting and receiving system according to some example embodiments.

FIG. 3 is another diagram showing the data transmitting and receiving system according to some example embodiments.

Referring to FIG. 3, the transmitting circuit 100 receives the first data D1, the clock (CK), and an inverted clock (CKB) obtained by inverting the clock (CK).

For reference, the description of the first data D1 may also be applied to other data in FIG. 2 (e.g., the n-th data Dn).

Figure 4:
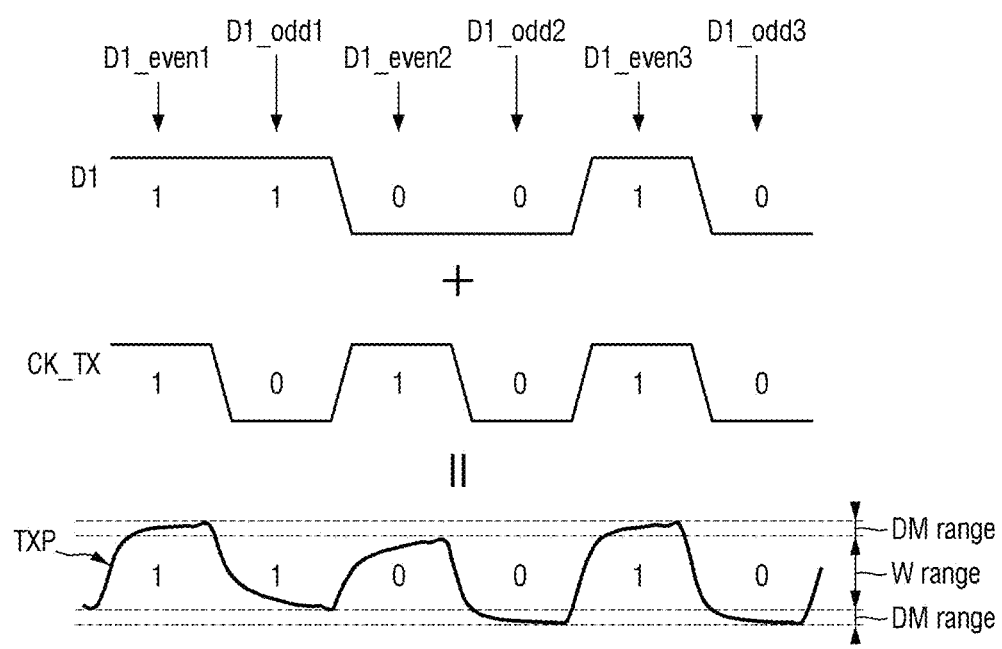
FIG. 4 is an example diagram for explaining an operation of generating data with modulated amplitude to be transmitted by the data transmitter according to some example embodiments.

The first data D1 may be, for example, data shown in FIG. 4.

FIG. 4 is an example diagram for explaining an operation of generating data with modulated amplitude to be transmitted by the data transmitter according to some example embodiments.

Referring to FIGS. 3 and 4, a part of the first data D1 is shown. A part of the first data D1 is an example, and a part of the first data D1 may have waveforms different from those shown in this drawing.

At least a part of the first data D1 is assumed to be 110010.

At this time, the transmitting circuit 100 may receive the first data D1 by dividing the first data into odd-numbered data (D1_odd) and even-numbered data (D1_even). That is, the first data D1 may be made up of odd-numbered data (D1_odd1 to D1_odd3) and even-numbered data (D1_even1 to D1_even3) that intersect each other. More specifically, the first data D1 may be configured in the order of a first even-numbered data (D1_even1), a first odd-numbered data (D1_odd1), a second even-numbered data (D1_even2), a second odd-numbered data (D1_odd2), a third even-numbered data (D1_even3), and a third odd-numbered data (D1_odd3).

The data transmitter 10 also includes a clock transmitting circuit 200, and the clock transmitting circuit 200 includes a clock driver 202. The clock driver 202 may include logic elements as described below in FIG. 9.

The clock driver 202 receives the clock (CK) to generate a transmission clock (CK_TX) that is transmitted through the second channel (Ch 2).

Each of the plurality of data communication lanes (110-1 to 110-n) explained in FIG. 2 may include a plurality of flip flops and a plurality of digitally controlled delay lines (DCDL).

For example, the first data communication lane 110-1 may include a plurality of flip flops 111 and 112, and a plurality of digitally controlled delay lines (DCDL) 113 and 114. The digitally controlled delay lines 113 and 114 may be, for example, signal delay circuits including a plurality of logic elements. The digitally controlled delay lines 113 and 114 may, for example, delay the input signal.

The plurality of flip flops 111 and 112 may be, for example, D-flip flops.

The first flip flop 111 may sequentially receive the odd-numbered data (D1_odd) for the first data D1. The first flip flop 111 may output odd-numbered data (dD1_odd) obtained by retiming the odd-numbered data (D1_odd) for the input first data D1. At this time, the first flip flop 111 receives the clock (CK) and performs the operation according to the clock (CK) signal.

The second flip flop 112 may sequentially receive the even-numbered data (D1_even) for the first data D1. The second flip flop 112 may output even-numbered data (dD1_even) obtained by retiming the even-numbered data (D1_even) for the received first data D1. At this time, the second flip flop 112 receives the inverted clock (CKB), and performs the operation according to the inverted clock (CKB) signal.

The first digitally controlled delay line 113 receives the inverted clock (CKB), delays the inverted clock (CKB), and outputs a delayed inverted clock (dCKBa).

A second digitally controlled delay line 114 receives the inverted clock (CKB), delays the inverted clock (CKB), and outputs a delayed inverted clock (dCKBb).

Each of the plurality of drivers (101-1 to 101-n) of FIG. 2 may include a data modulation (DM) driver and a weak driver.

For example, the first driver 101-1 includes a data modulation driver 102 and a weak driver 103.

Figure 5:
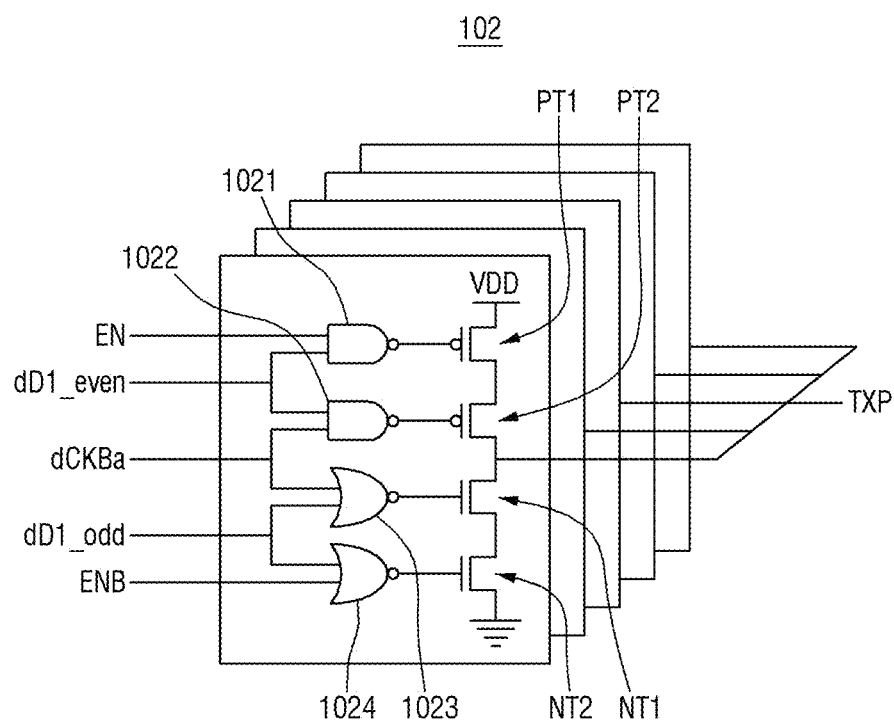
FIG. 5 is an example diagram for describing a data modulation driver of the data transmitting and receiving system according to some example embodiments.

The data modulation driver 102 may be configured, for example, as in FIG. 5.

FIG. 5 is an example diagram for describing a data modulation driver of the data transmitting and receiving system according to some example embodiments.

Referring to FIGS. 3 and 5, the data modulation driver 102 may include, for example, two NAND gates 1021 and 1022 and two NOR gates 1023 and 1024. The data modulation driver 102 may include, for example, NMOS transistors NT1 and NT2 connected in series, and PMOS transistors PT1 and PT2 connected in series.

The data modulation driver 102 will be described in detail.

The first NAND gate 1021 receives an enable signal (EN) and the delayed even-numbered data (dD1_even). The second NAND gate 1022 receives the retimed even-numbered data (dD1_even) and the delayed inverted clock (dCKBa). Also, the first NOR gate 1023 receives the delayed inverted clock (dCKBa) and the retimed odd-numbered data (dD1_odd). The second NOR gate 1024 receives the retimed odd-numbered data (dD1_odd) and an inverted enable signal (EN B) obtained by inverting the enable signal (EN).

The PMOS transistors PT1 and PT2 and the NMOS transistors NT1 and NT2 may be sequentially connected in series.

More specifically, a source of the first PMOS transistor PT1 is connected to a power supply voltage (VDD), a drain of the first PMOS transistor PT1 is connected to a source of the second PMOS transistor PT2, a drain of the second PMOS transistor PT2 is connected to a drain of the first NMOS transistor NT1, a source of the first NMOS transistor NT1 is connected to a drain of the second NMOS transistor NT2, and a source of the second NMOS transistor NT2 is grounded.

The first PMOS transistor PT1 is gated by the output of the first NAND gate 1021. The second PMOS transistor PT2 is gated by the output of the second NAND gate 1022. The first NMOS transistor NT1 is gated by the output of the first NOR gate 1023. The second NMOS transistor NT2 is gated by the output of the second NOR gate 1024.

An output TXP may be generated from a node at which the second PMOS transistor PT2 and the first NMOS transistor NT1 are connected.

The amplitude of the output TXP may be modulated through the PMOS transistors PT1 and PT2 connected in series and the NMOS transistors NT1 and NT2 connected in series included in the data modulation driver 102.

For example, the data modulation driver 102 may operate when the retimed even-numbered data (dD1_even) is "1" and the delayed inverted clock (CKB) is logic high. Also, the data modulation driver 102 may operate when the retimed odd-numbered data dD1_odd is "0" and the delayed inverted clock (CKB) is logic low.

At this time, the amount of amplitude modulation of the output TXP may be adjusted. That is, by increasing the turned-on number of the block including the two NAND gates 1021 and 1022 and the two NOR gates 1023 and 1024, the PMOS transistors PT1 and PT2 connected in series, and the NMOS transistors NT1 and NT2 connected in series, the amount of amplitude modulation of the output TXP may be increased.

Also, the data modulation driver 102 may also perform the role of receiving half-rate data (e.g., the even-numbered data (D1_even) and the odd-numbered data (D1_odd)) of the first data D1, and serializing them into serialized full-rate data (e.g., the first data D1).

The operation of the data modulation driver 102 will be described through graphs of FIGS. 6 and 7 below.

Figure 6:
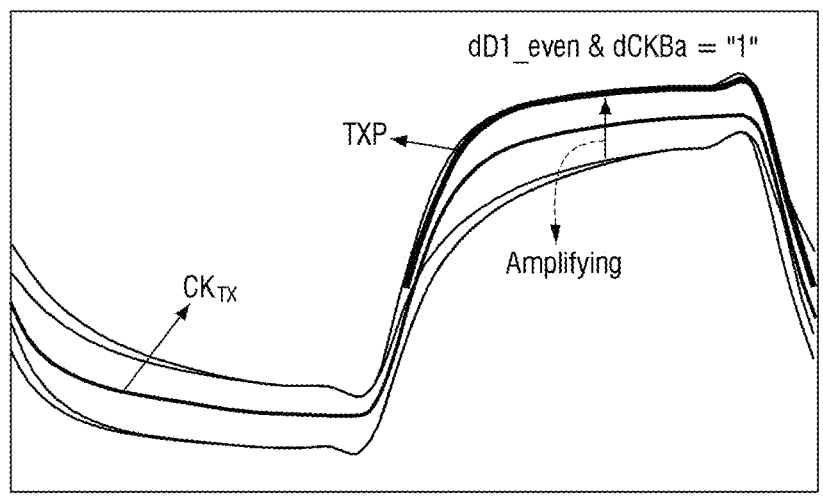
FIGS. 6 and 7 are example graphs for explaining a part of the operation of a data modulation driver according to some example embodiments.
Figure 7:
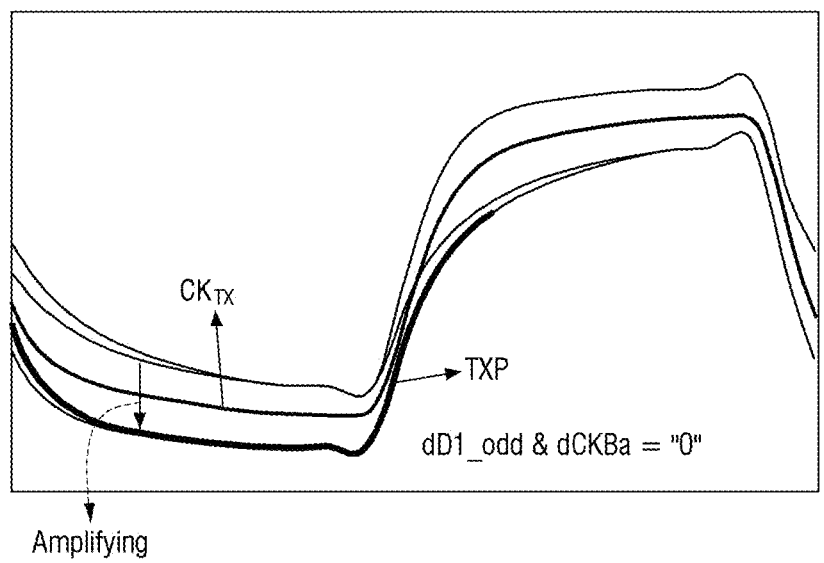

FIGS. 6 and 7 are example graphs for explaining a part of the operation of a data modulation driver according to some example embodiments.

Referring to FIGS. 3, 5, and 6, for example, when both the even-numbered data (dD1_even) and the delayed inverted clock (dCKBa) have "1", the output (TXP) of the data modulation driver 102 may be amplified more than the clock signal (CK_TX) that is output by the clock driver 103.

Referring to FIGS. 3, 5 and 7, for example, when both the odd-numbered data (dD1_odd) and the delayed inverted clock (dCKBa) have "0", the output (TXP) of the data modulation driver 102 may be amplified in a direction that becomes smaller than that of the clock signal (CK_TX) that is output by the clock driver 103.

Referring again to FIG. 3, the retimed odd-numbered data (dD1_odd), the retimed even-numbered data (dD1_even), and the delayed inverted clock (dCKBa) may be transmitted to the data modulation driver 102.

The delayed inverted clock (dCKBb) output through the second digitally controlled delay line 114 is transmitted to the weak driver 103.

Figure 8:
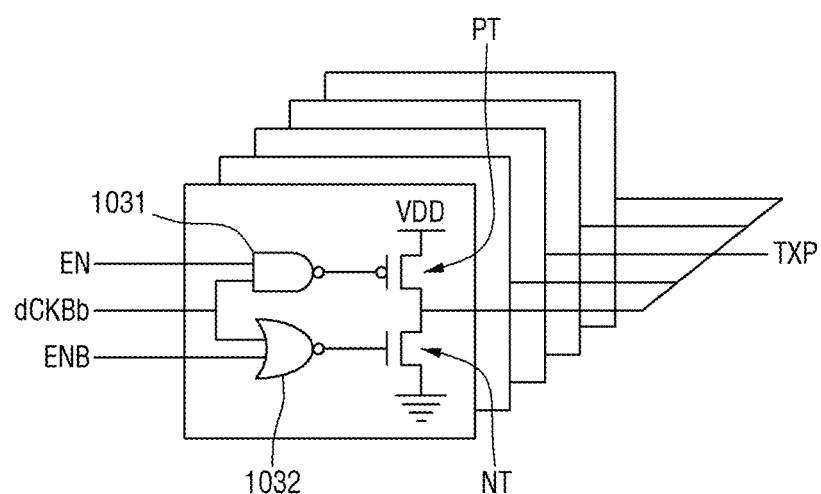
FIG. 8 is an exemplary diagram for describing the weak driver of the data transmitting and receiving system according to some example embodiments.

The weak driver 103 may be configured, for example, as in FIG. 8.

FIG. 8 is an example diagram for describing the weak driver of the data transmitting and receiving system according to some example embodiments.

Referring to FIGS. 3 and 8, the weak driver 103 may include, for example, a NAND gate 1031 and a NOR gate 1032. The weak driver 103 may also include, for example, a PMOS transistor (PT) and an NMOS transistor (NT) connected in series.

The weak driver 103 will be described in detail.

The NAND gate 1031 receives the enable signal (EN) and the delayed inverted clock (dCKBb). The NOR gate 1032 also receives the delayed inverted clock (dCKBb) and the inverted enable signal (ENB).

The PMOS transistor (PT) and the NMOS transistor (NT) may be connected sequentially in series.

More specifically, the source of the PMOS transistor (PT) is connected to the power supply voltage (VDD), the drain of the PMOS transistor (PT) is connected to the drain of the NMOS transistor (NT), and the source of the NMOS transistor (NT) is grounded.

The PMOS transistor (PT) is gated by the output of the NAND gate 1031. The NMOS transistor (NT) is gated by the output of the NOR gate 1032.

An output (TXP) may be generated from a node at which the PMOS transistor (PT) and the NMOS transistor (NT) are connected. The weak driver 103 may generate signals with amplitude of small size, unlike the data modulation driver 102.

The signal of the delayed inverted clock (dCKBb) may be amplified through the PMOS transistor (PT) and NMOS transistor (NT) connected in series included in the weak driver 103.

At this time, the intensity of amplifying the signal of the delayed inverted clock (dCKBb) may be adjusted. That is, by increasing the turned-on number of the blocks including the NAND gate 1031, the NOR gate 1032, and the PMOS transistor (PT) and the NMOS transistor (NT) connected in series, the intensity of amplifying the delayed inverted clock (dCKBb) signal may be made stronger.

Referring again to FIGS. 3 and 4, the clock transmitting circuit 200 includes the clock driver 202. The clock driver 202 adjusts the amplitude of the clock (CK) to output an output (CK_TX), and transmits it to the data receiver 30 through the second channel (Ch 2).

The clock driver 202 will be described in detail through FIG. 9.

Figure 9:
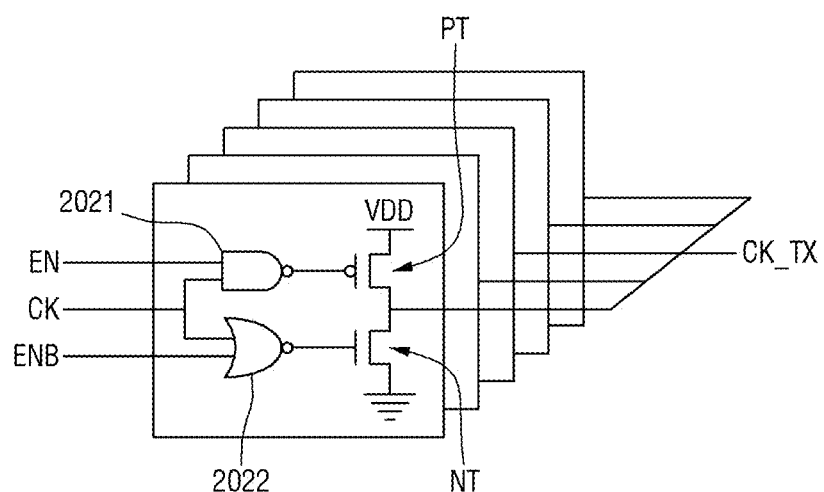
FIG. 9 is an exemplary diagram for describing a clock driver of the data transmitting and receiving system according to some example embodiments.

FIG. 9 is an example diagram for describing a clock driver of the data transmitting and receiving system according to some example embodiments.

Referring to FIGS. 3 and 9, the clock driver 202 may include, for example, a NAND gate 2021 and a NOR gate 2022. Also, the clock driver 202 may include, for example, a PMOS transistor (PT) and an NMOS transistor (NT) connected in series.

The clock driver 202 will be described in detail.

The NAND gate 2021 receives the enable signal (EN) and the clock (CK). The NOR gate 2022 also receives the clock (CK) and the inverted enable signal (ENB).

The PMOS transistor (PT) and NMOS transistor (NT) may be connected sequentially in series.

More specifically, the source of the PMOS transistor (PT) is connected to the power supply voltage (VDD), the drain of the PMOS transistor (PT) is connected to the drain of the NMOS transistor (NT), and the source of the NMOS transistor (NT) is grounded.

The PMOS transistor (PT) is gated by the output of the NAND gate 2021. The NMOS transistor (NT) is gated by the output of the NOR gate 2022.

An output (CK_TX) may be generated from a node at which the PMOS transistor (PT) and the NMOS transistor (NT) are connected.

The signal of the clock (CK) may be amplified through the PMOS transistor (PT) and the NMOS transistor (NT) connected in series included in the clock driver 202.

At this time, the intensity of amplifying the signal of the clock (CK) may be adjusted. That is, by increasing the turned-on number of the blocks including the NAND gate 2021, the NOR gate 2022, and the PMOS transistor (PT) and the NMOS transistor (NT) connected in series, the intensity of amplifying the signal of the clock (CK) may be made stronger.

The size of the elements that make up the weak driver 103 shown in FIG. 8 and the clock driver 202 shown in FIG. 9 may be different from each other. That is, the intensity amplified by the weak driver 103 and the intensity amplified by the clock driver 202 may be different from each other.

Referring to FIGS. 3 and 4 again, the weak driver 103 and the data modulation driver 102 may alternately operate, when they fall within an arbitrarily determined range with respect to the magnitude of the signal (CK_TX) output from the clock driver 202.

For example, the weak driver 103 generates a signal with amplitude smaller than amplitude of the signal (CK_TX) output from the clock driver 202. A peak-to-peak amplitude of the signal generated by the weak driver 103 corresponds to a weak range (W range). The signal generated by the weak driver 103 may generate an output TXP through the node (n_txZ). At this time, the data modulation driver 102 does not operate.

The data modulation driver 102 may also operate when necessary (e.g., dD1_even & dCKBa=1 or dD1_odd & dCKBa=0) to add the amplitude to the signal generated by the weak driver 103 to generate the output (TXP).

That is, since the data is embedded in the clock signal, the data transmitter 10 and the receiver 30 according to some example embodiments do not user or require the circuits associated with clocking for controlling separate clocks (e.g., the duty cycle correction (DCC) circuit, the duty cycle detection (DCD) circuit, or the like). Accordingly, it is possible to enhance the space utilization of the chip including the data transmitter 10 and the receiver 30.

Further, the data transmitter 10 according to some example embodiments may transmit the data information to the data receiver 30, by transmitting the signal (TXP) obtained by embedding data in the clock signal, together with the signal (CK_TX) output through the clock transmitting circuit 200, to the data receiver 30.

Next, the data receiver 30 will be described with reference to FIG. 3.

The data receiver 30 includes a plurality of resistors R1 and R2, a plurality of comparators 310 and 312, and a plurality of latches 320 and 322.

The plurality of resistors R1 and R2 may be, for example, ODT (On Die Termination) resistors.

The data receiver 30 receives the reception signal (RXP) through the first-1 channel (Ch 1-1), and receives the clock (CK_RX) through the second channel (Ch 2).

The clock (CK_RX) received through the second channel (Ch 2) is not a sampling clock.

At this time, the data receiver 30 outputs a recovered even-numbered data (rD1_even) which is obtained by recovering the even-numbered data (D1_even) input to the data transmitter 10, and a recovered odd-numbered data (rD1_odd) which is obtained by recovering the odd-numbered data (D1_odd) input to the data transmitter 10, on the basis of the received signal (RXP) and the clock (CK_RX).

The data receiver 30 may output the recovered even-numbered data (rD1_even) through a first type path (N-type path) made up of the first resistor R1, the first comparator 310, and the first latch 320. The data receiver 30 may also output the recovered odd-numbered data (rD1_odd) through a second type path (P-type path) made up of the second resistor R2, the second comparator 312, and the second latch 322. A "path" may be a circuit including one or more circuit components, such as the components described in example embodiments of paths herein.

A specific configuration and operation of the data receiver 30 will be described below.

Figure 10:
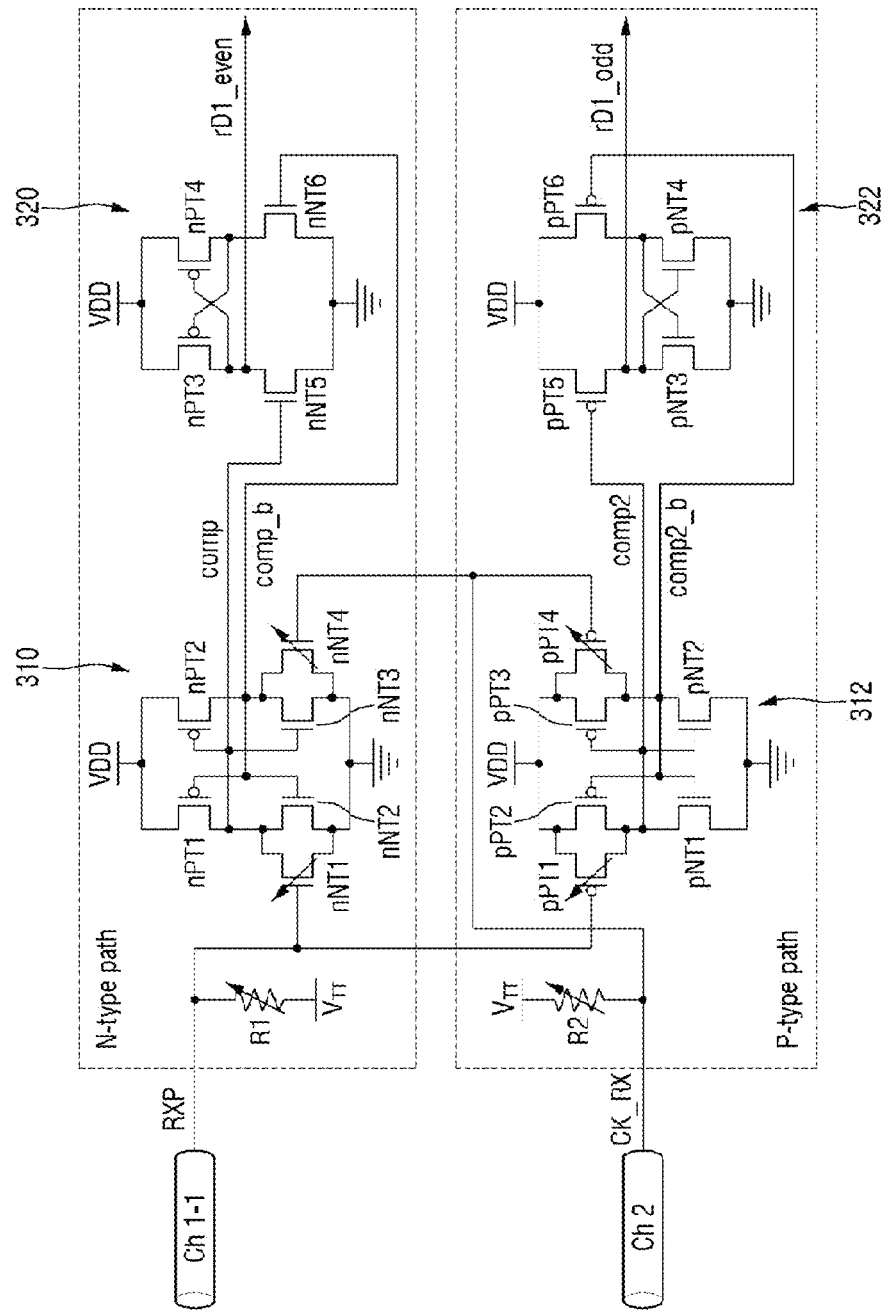
FIG. 10 is an example diagram for explaining the data receiver according to some example embodiments.

FIG. 10 is an example diagram for explaining the data receiver according to some example embodiments.

Referring to FIGS. 9 and 10, the data receiver outputs the recovered even-numbered data (rD1_even) through the first type path (N-type path), and outputs the recovered odd-numbered data (rD1_odd) through the second type path (P-type path).

The first type path (N-type path) includes the first resistor R1, the first comparator 310 and the first latch 320. The first type path (N-type path) receives the signal (RXP) through a node at which the first-1 channel (Ch 1-1) and the first resistor R1 are connected.

The first resistor R1 may be connected to a terminal voltage $V_{TT}$.

The signal (RXP) is a signal transmitted to the data receiver 30 after the signal (TXP) transmitted from the data transmitter 10 passes through the first-1 channel (Ch 1-1).

The first comparator 310 includes a plurality of PMOS transistors nPT1 and nPT2, and a plurality of NMOS transistors nNT1, nNT2, nNT3, and nNT4.

The first comparator 310 receives the signal (RXP) through the first NMOS transistor nNT1. Also, the first comparator 310 receives the clock signal (CK_RX) through the fourth NMOS transistor nNT4.

The clock signal (CK_RX) is a clock transmitted to the data receiver 30 after the clock (CK_TX) transmitted from the data transmitter 10 passes through the second channel (Ch 2).

Sources of the first NMOS transistor nNT1, the second NMOS transistor nNT2, the third NMOS transistor nNT3, and the fourth NMOS transistor nNT4 are grounded.

Drains of the first NMOS transistor nNT1 and the second NMOS transistor nNT2 are connected to a drain of the first PMOS transistor pPT1 to output a first comparison signal (comp).

Also, drains of the third NMOS transistor nNT3 and the fourth NMOS transistor nNT4 are connected to a drain of the second PMOS transistor nPT2 to output a second comparison signal (comp_b).

Gates of the second NMOS transistor nNT2 and the first PMOS transistor pPT1 are connected to each other to output the second comparison signal (comp_b).

Also, the gates of the third NMOS transistor nNT3 and the second PMOS transistor nPT2 are connected to each other to output the first comparison signal (comp).

The first latch 320 includes a plurality of NMOS transistors nNT5 and nNT6, and a plurality of PMOS transistors nPT3 and nPT4.

The first latch 320 is, for example, a dynamic latch, and the configuration of the first latch 320 may be another configuration that operates as a dynamic latch.

The first latch 320 receives the first comparison signal (comp) through the fifth NMOS transistor nNT5, and receives the second comparison signal (comp_b) through the sixth NMOS transistor nNT6.

The third PMOS transistor nPT3 and the fourth PMOS transistor nPT4 form a latch.

The first latch 320 outputs the recovered even-numbered data (rD1_even) through a node at which the drain of the third PMOS transistor nPT3 and the drain of the fifth NMOS transistor nNT5 are connected.

The second type path (P-type path) includes a second resistor R2, a second comparator 312, and a second latch 322. The second type path (P type path) receives the clock (CK_RX) through a node at which the second channel (Ch 2) and the second resistor R2 are connected. The second resistor R2 may be connected to the terminal voltage $V_{TT}$.

The second comparator 312 includes a plurality of NMOS transistors pNT1 and pNT2, and a plurality of PMOS transistors pPT1, pPT2, pPT3, and pPT4.

The second comparator 312 receives the signal (RXP) through the first PMOS transistor pPT1. Also, the second comparator 312 receives the clock signal (CK_RX) through the fourth PMOS transistor pPT4.

Sources of the first PMOS transistor pPT1, the second PMOS transistor pPT2, the third PMOS transistor pPT3, and the fourth PMOS transistor pPT4 are connected to the power supply voltage (VDD).

Drains of the first PMOS transistor pPT1 and the second PMOS transistor pPT2 are connected to the drain of the first NMOS transistor pNT1 to output a third comparison signal (comp2).

Also, drains of the third PMOS transistor pPT3 and the fourth PMOS transistor pPT4 are connected to the drain of the second NMOS transistor pNT2 to output a fourth comparison signal (comp2_b).

Gates of the second PMOS transistor pPT2 and the first NMOS transistor pNT1 are connected to each other to output the fourth comparison signal (comp2_b).

Also, the gates of the third PMOS transistor pPT3 and the second NMOS transistor pNT2 are connected to each other to output the third comparison signal (comp2).

The second latch 322 includes a plurality of NMOS transistors pNT3 and pNT4, and a plurality of PMOS transistors pPT5 and pPT6.

The second latch 322 is, for example, a dynamic latch, and the configuration of the second latch 322 may be another configuration that operates as a dynamic latch.

The second latch 322 receives the third comparison signal (comp2) through the fifth PMOS transistor pPT5, and receives the fourth comparison signal (comp2_b) through the sixth PMOS transistor pPT6.

The third NMOS transistor pNT3 and the fourth NMOS transistor pNT4 form a latch.

The second latch 322 outputs the recovered odd-numbered data (rD1_odd) through a node at which the drain of the third NMOS transistor pNT3 and the drain of the fifth PMOS transistor pPT5 are connected.

At this time, the first type path (N-type path) evaluates data when a common mode level received by the first comparator 310 and the second comparator 312 of the data receiver 30 is lower than an arbitrarily specified level, and the second type path (P-type path) evaluates data when the common mode level is higher than an arbitrarily specified level.

That is, the serialized data received from the data transmitter 10 may be automatically parallelized and output, without the need for circuits associated with clocking for controlling separate clocks in the data receiver 30 (e.g., a clock-and-data recovery (CDR) circuit, a duty cycle correction (DCC) circuit or a duty cycle detection (DCD) circuit, etc.) (for example, the serialized signal (RXP) may be parallelized into the recovered even-numbered data (rD1_even) and the recovered odd-numbered data (rD1_odd) and output).

This makes it possible to easily perform the space utilization of a chip that includes the data receiver 30 according to some example embodiments.

The operation of the data receiver 30 will be described below in detail through graphs.

Figure 11:
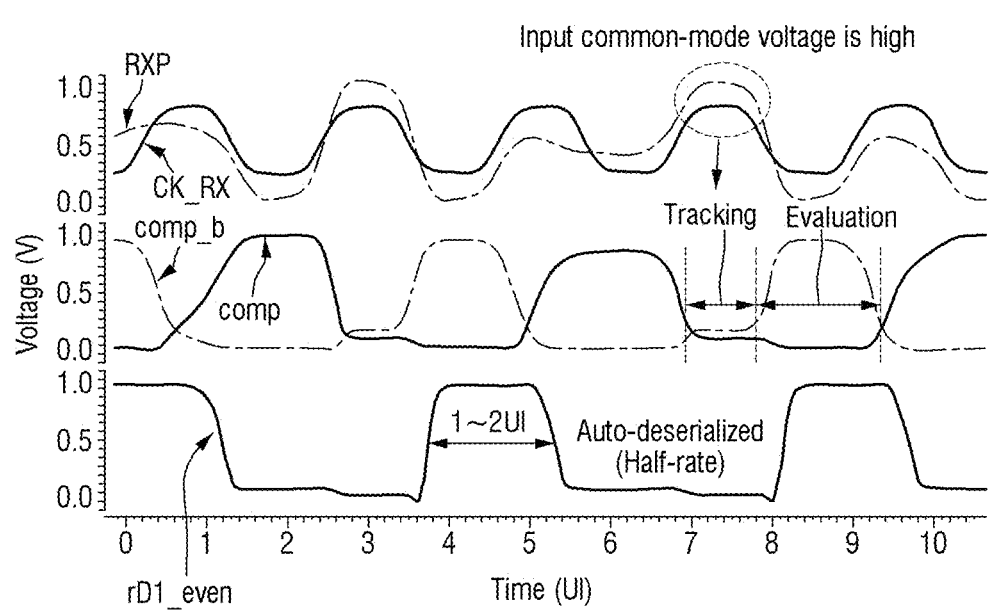
FIG. 11 is an example diagram for explaining the operation of the data receiver according to some example embodiments.

FIG. 11 is an example diagram for explaining the operation of the data receiver according to some example embodiments.

Referring to FIGS. 10 and 11, the signal (RXP) and the clock (CK_RX) received by the data receiver 30 are shown in the graphs.

At this time, the common mode level input to the first comparator 310 and the second comparator 312 is assumed to be higher or lower than an arbitrarily specified level, and an example in which the first type path (N-type path) operates will be explained.

For convenience of explanation, the operation of the data receiver 30 will be described, by way of an example of an interval displayed when the input common-mode voltage is high.

The first comparator 310 may determine the data received by oneself as 1 or 0 for the serialized signals (RXP). The data is then updated through the first latch 320, and the data may be automatically deserialized. That is, the recovered even-numbered data (rD1_even) may be extracted as a part of the operation of extracting the parallelized data of the serialized signal (RXP).

For example, the recovered even-numbered data (rD1_even) extracted through the operation of the first comparator 310 and the first latch 320 may have a constant logic high (e.g., 1V) during UI (Unit Interval) of 1 or more and 2 or less.

At this time, a tracking step and an evaluation step may be performed to extract the recovered even-numbered data (rD1_even) between 8 UI and 10 UI in the first comparator 310.

Figure 12:
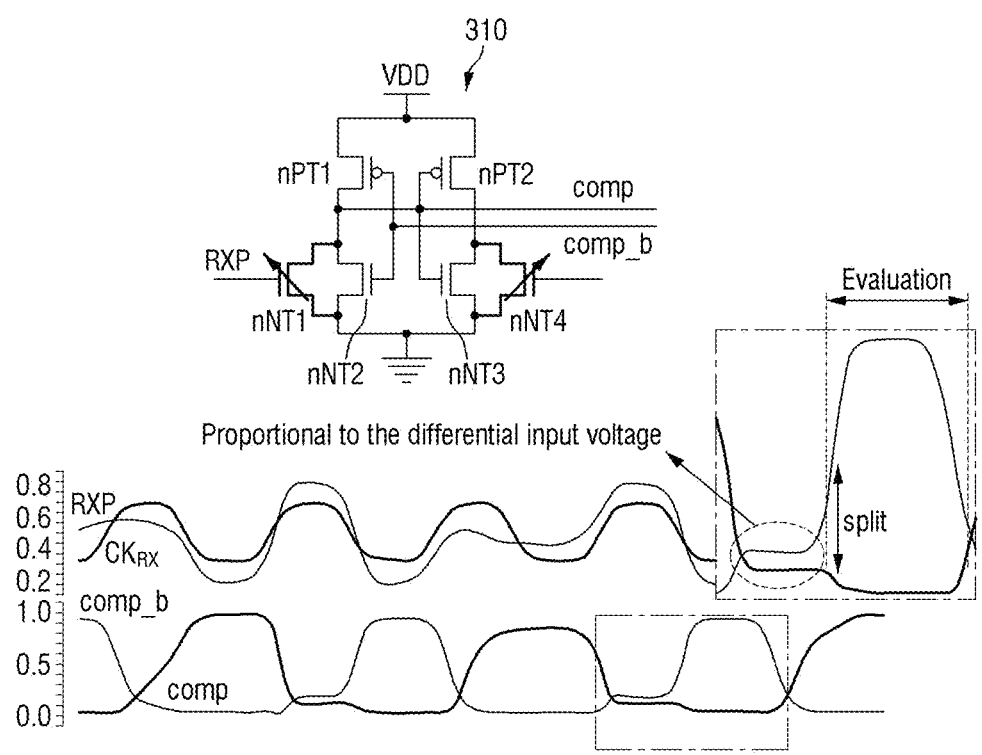
FIG. 12 is an example another diagram for explaining the operation of the data receiver according to some example embodiments.

In the tracking step, the first comparison signal (comp) and the second comparison signal (comp_b) have a small voltage difference other than zero. The small voltage difference mentioned above is proportional to a differential input voltage value. Referring to FIG. 12, the small voltage difference mentioned above other than zero may help split the data into 1 or 0 in the evaluation step. When the input common mode voltage drops, the small voltage difference other than zero may be amplified through regeneration of voltage. After that, the recovered even-numbered data (rD1_even) may be output through the first latch 320.

This will be explained in detail through FIG. 12.

FIG. 12 is an example diagram for explaining the operation of the data receiver according to some example embodiments.

Referring to FIGS. 10 to 12, it may be seen that the first comparison signal (comp) and the second comparison signal (comp_b) have the aforementioned small voltage difference other than zero in the tracking step.

Accordingly, the serialized data received from the data transmitter 10 may be automatically parallelized and output, without the need for circuits associated with clocking for controlling separate clocks in the data receiver 30 (e.g., a clock-and-data recovery (CDR) circuit, a duty cycle correction (DCC) circuit, a duty cycle detection (DCD) circuit, etc.) (for example, the serialized signal (RXP) may be parallelized into the recovered even-numbered data (rD1_even) and the recovered odd-numbered data (rD1_odd) and output).

This makes it possible to easily perform the space utilization of a chip that includes the data receiver 30 according to some example embodiments.

Needless to say, the description of the first type path (N-type path) is also applicable to the second type path (P-type path).

Figure 13:
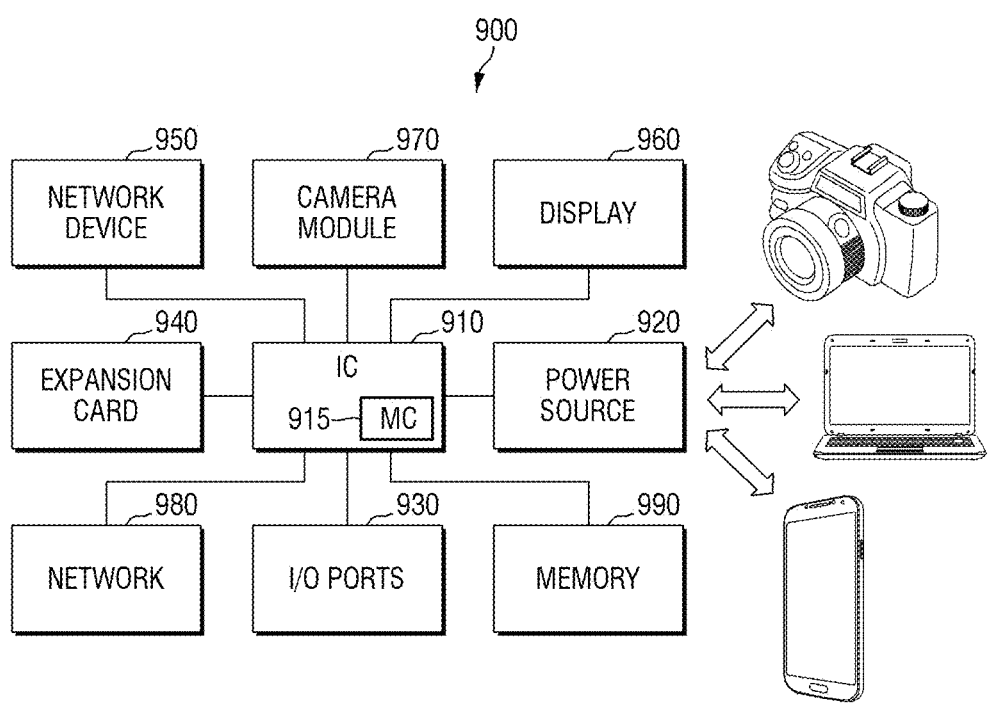
FIG. 13 is an example diagram for describing the data transmitting and receiving system according to some example embodiments.

FIG. 13 is an example diagram for describing the data transmitting and receiving system according to some example embodiments.

Referring to FIG. 13, a memory system 900 to which the data transmitting and receiving system according to some example embodiments described above through FIGS. 1 to 12 is applicable is shown.

The memory system 900 may be implemented as a portable electronic device such as a digital camera, a cellular phone, a smart phone, a tablet PC or a mobile Internet device, but example embodiments are not limited thereto. The memory system 900 may include an integrated circuit 910, a power source 920, I/O ports 930, an expansion card 940, a network device 950, a display 960, and a plurality of memory devices 980 to 990.

The memory system 900 may further include a camera module 970. The integrated circuit 910 may control the operation of at least one of the elements 920 to 970. The integrated circuit 910 may be implemented as a processor, a system on chip (SoC), an application processor or a mobile application processor, but example embodiments are not limited thereto.

The integrated circuit 910 may include a memory controller 915 for controlling a plurality of memory devices 980 and 990.

The memory controller 915 may be implemented outside the integrated circuit 910. The power source 920 may provide an operating voltage to at least one of the elements 910, and 930 to 990. The I/O ports 930 may mean ports that may transmit data to the memory system 900 or transmit the data output from the memory system 900 to an external device.

The expansion card 940 may be implemented as a secure digital (SD) card or a multimedia card (MMC). The expansion card 940 may be implemented as a subscriber identification module (SIM) card or a universal subscriber identity module (USIM) card.

The network device 950 may mean a device that may connect the memory system 900 to a wireless network. The display 960 may display data that is output from the I/O ports 930, the expansion card 940 or the network device 950.

The camera module 970 means a module that may convert an optical image into an electrical image. Therefore, the electrical image output from the camera module 970 may be stored in the integrated circuit 910 or the expansion card 940. Additionally, the electrical image output from the camera module 970 may be displayed through the display 960 under the control of the integrated circuit 910.

Each of the first memory device 980 and the second memory device 990 may be implemented as a volatile memory device such as a DRAM or a non-volatile memory device such as a flash. The first memory device 980 and the second memory device 990 may be distinguished by at least one of a physical distance from the memory controller 915, a connection relationship with the memory controller 915, an error correction capability, and a memory supply voltage.

According to the inventive concepts, the memory controller 915 may transmit data, by sending a clock whose transition point is adjusted on the basis of the transmission data to the first memory device 980 and the second memory device 990.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

Although example embodiments of the inventive concepts have been described above with reference to the accompanying drawings, the inventive concepts are not limited to the aforementioned example embodiments, and may be manufactured in various forms different from each other. It will be understood by a person having an ordinary knowledge in the technical field of the inventive concepts that the inventive concepts may be embodied in other specific forms without changing the scope of the inventive concepts. Accordingly, the example embodiments mentioned above are to be considered in all respects as illustrative rather than restrictive.

What is claimed is:

1. A data transmitter comprising:
a transmitting circuit configured to transmit data, the data including alternating odd-numbered data and even-numbered data, the transmitting circuit including a first flip flop configured to receive the odd-numbered data and generate retimed odd-numbered data, and a second flip flop configured to receive the even-numbered data and generate retimed even-numbered data;
a clock transmitting circuit configured to supply a clock signal to the transmitting circuit, the clock transmitting circuit including a clock driver configured to transmit the clock signal to a receiver that receives the data;
a data modulation driver configured to receive the retimed odd-numbered data and the retimed even-numbered data; and
a weak driver having an output coupled with an output of the data modulation driver.

2. The data transmitter of claim 1,
wherein the data modulation driver and the weak driver are configured to generate data with modulated amplitude.

3. The data transmitter of claim 2,
wherein the transmitting circuit further includes a first digitally controlled delay line configured to receive an inverted clock signal obtained by inverting the clock signal to generate a delayed inverted clock signal.

4. The data transmitter of claim 3, wherein
the delayed inverted clock signal is sent to the data modulation driver, and
the data modulation driver is configured to generate the data with modulated amplitude, according to the delayed inverted clock signal.

5. The data transmitter of claim 2,
wherein the data modulation driver includes a plurality of logic elements and a plurality of transistors.

6. The data transmitter of claim 1,
wherein the transmitting circuit further includes a digitally controlled delay line configured to receive an inverted clock signal obtained by inverting the clock signal to generate a delayed inverted clock signal.

7. The data transmitter of claim 6,
wherein the weak driver is configured to receive the delayed inverted clock signal, and the weak driver is not configured to receive the odd-numbered data and the even-numbered data.

8. The data transmitter of claim 1,
wherein the clock signal is transmitted to a first digitally controlled delay line.

9. The data transmitter of claim 1,
wherein the transmitting circuit is configured to generate data with modulated amplitude obtained by changing an amplitude of the clock signal with respect to a signal that repeats high and low, and transmit the data to the receiver.

10. A data receiver comprising:
a receiving circuit configured to receive data from a transmitter and receive a clock signal from the transmitter,
wherein the receiving circuit includes a first type circuit configured to receive the data and the clock signal and evaluate the data when an input common mode is low, and a second type circuit configured to receive the data and clock signal and evaluate the data when the input common mode is high,
wherein the first type circuit includes a first comparator configured to receive the data and the clock signal to generate a first comparison signal and a second comparison signal, and a first latch configured to receive the first comparison signal and the second comparison signal, and
the second type circuit includes a second comparator configured to receive the data and the clock signal to generate a third comparison signal and a fourth comparison signal, and a second latch configured to receive the third comparison signal and the fourth comparison signal.

11. The data receiver of claim 10,
wherein the first type circuit further includes a first resistor.

12. The data receiver of claim 11,
wherein the first resistor is an On Die Termination (ODT) resistor.

13. The data receiver of claim 10,
wherein the second type circuit further includes a second resistor.

14. The data receiver of claim 13,
wherein the second resistor is an On Die Termination (ODT) resistor.

15. A data transmitting and receiving system comprising:
a data transmitter which includes a clock transmitting circuit configured to transmit a clock signal, and a transmitting circuit configured to transmit data with modulated amplitude by embedding data in the clock signal;
a first channel configured to transmit the data with modulated amplitude;
a second channel configured to transmit the clock signal; and
a data receiver which includes a receiving circuit connected to the first channel and the second channel, wherein
the transmitting circuit is configured to receive data, divide the data into odd-numbered data and even-numbered data intersecting each other, generate the data with modulated amplitude, and transmit the data to the first channel, and
the receiving circuit has a first type circuit configured to evaluate data when an input common mode voltage between the data with modulated amplitude and the clock signal is lower than a reference value, and a second type circuit configured to evaluate data when the input common mode voltage is higher than the reference value.

16. The data transmitting and receiving system of claim 15, wherein the transmitting circuit includes
a first flip flop configured to receive the odd-numbered data to generate retimed odd-numbered data, and
a second flip flop configured to receive the even-numbered data to generate retimed even-numbered data,
wherein the clock transmitting circuit includes a clock driver configured to transmit the clock signal to the receiver.

17. The data transmitting and receiving system of claim 16,
wherein the transmitting circuit further includes a data modulation driver and a weak driver configured to receive the retimed odd-numbered data and the retimed even-numbered data to generate the data with modulated amplitude.

18. The data transmitting and receiving system of claim 17, wherein
the transmitting circuit further includes a first digitally controlled delay line configured to receive an inverted clock signal obtained by inverting the clock signal, and generate a delayed inverted clock signal,
the delayed inverted clock signal is transmitted to the data modulation driver, and
the data modulation driver is configured to generate the data with modulated amplitude according to the delayed inverted clock signal.

19. The data transmitting and receiving system of claim 15, wherein the transmitting circuit further includes
a second digitally controlled delay line configured to receive an inverted clock signal obtained by inverting the clock signal, and generate a delayed inverted clock signal, and
a weak driver configured to receive the delayed inverted clock signal, wherein the weak driver is not configured to receive the odd-numbered data and the even-numbered data.

20. The data transmitting and receiving system of claim 15, wherein
the first type circuit includes a first resistor,
the second type circuit includes a second resistor, and
the first resistor and the second resistor are On Die Termination (ODT) resistors.

* * * * *